US010230381B2

(12) United States Patent
Deng et al.

(10) Patent No.: US 10,230,381 B2
(45) Date of Patent: Mar. 12, 2019

(54) FREQUENCY DIVIDER

(71) Applicant: Cavium, LLC, Santa Clara, CA (US)

(72) Inventors: JingDong Deng, Acton, MA (US);
Omer O. Yildirim, Marlborough, MA (US)

(73) Assignee: Cavium, LLC, Santa Clara, CA (US)

( * ) Notice: Subject to any disclaimer, the term of this patent is extended or adjusted under 35 U.S.C. 154(b) by 0 days.

(21) Appl. No.: 15/586,867

(22) Filed: May 4, 2017

(65) Prior Publication Data

US 2018/0323792 A1     Nov. 8, 2018

(51) Int. Cl.
| | |
|---|---|
| *H03K 23/00* | (2006.01) |
| *H03L 7/193* | (2006.01) |
| *H03K 3/356* | (2006.01) |
| *H03K 23/44* | (2006.01) |
| *H03L 7/099* | (2006.01) |
| *H03L 7/089* | (2006.01) |
| *H03L 7/081* | (2006.01) |
| *H03K 3/3562* | (2006.01) |

(52) U.S. Cl.
CPC ......... *H03L 7/193* (2013.01); *H03K 3/35625* (2013.01); *H03K 3/356139* (2013.01); *H03K 23/44* (2013.01); *H03L 7/081* (2013.01); *H03L 7/0891* (2013.01); *H03L 7/0996* (2013.01)

(58) Field of Classification Search
CPC ....... H03L 7/193; H03L 7/081; H03L 7/0891; H03L 7/0996; H03K 3/356139; H03K 3/35625; H03K 23/44
USPC ........................................................ 327/115
See application file for complete search history.

(56) References Cited

U.S. PATENT DOCUMENTS

| | | | | |
|---|---|---|---|---|
| 8,565,368 | B1 * | 10/2013 | Chen ...................... | H03K 23/68 377/47 |
| 8,599,997 | B2 * | 12/2013 | Chen .................... | H03K 23/667 377/47 |
| 9,118,333 | B1 * | 8/2015 | Mika ....................... | H03K 23/70 |
| 9,577,646 | B1 * | 2/2017 | Pandita .................... | H03L 7/18 |
| 2004/0202275 | A1 * | 10/2004 | Wang ................... | H03C 3/0925 377/47 |
| 2005/0258878 | A1 * | 11/2005 | Neurauter ............ | H03K 23/667 327/115 |
| 2009/0213980 | A1 * | 8/2009 | Ding .................... | H03K 23/584 377/48 |

(Continued)

OTHER PUBLICATIONS

Vaucher, C.S., et al., "A Family of Low-Power Truly Modular Programmable Dividers in Standard 0.35-µm CMOS Technology," *IEEE Journal of Solid-State Circuits*, 35(7): 1039-1045 (Jul. 2000).

*Primary Examiner* — Ryan Jager
(74) *Attorney, Agent, or Firm* — Hamilton, Brook, Smith & Reynolds, P.C.

(57) ABSTRACT

A frequency divider circuit comprises a first divider chain including at least one first divider cell and a second divider chain coupled to the first divider chain to form an extendable divider chain. The second divider chain includes at least one second divider cell with a respective reset control. An effective length of the extendable divider chain may be altered, dynamically, via the respective reset control. Altering the effective length, dynamically, enables a division ratio of the frequency divider circuit to be changed, dynamically. The frequency divider circuit may be advantageously employed by applications that rely upon a dynamic division ratio, such as a fractional-N (frac-N) phase-locked loop (PLL).

20 Claims, 10 Drawing Sheets

(56) References Cited

U.S. PATENT DOCUMENTS

2012/0194220 A1* 8/2012 Cavin ..................... G06F 1/08
326/104

* cited by examiner

FREQUENCY DIVIDER

BACKGROUND

A phase-locked loop (PLL), also referred to interchangeably herein as a frequency synthesizer, is a negative feedback system that locks a phase and frequency of a higher frequency device, usually a voltage controlled oscillator (VCO), whose phase and frequency are not very stable over temperature and time, to a more stable and lower frequency device, usually a temperature compensated or oven controlled crystal oscillator. A PLL is typically employed when there is a need for a high frequency local oscillator (LO) source. Example applications of PLLs are numerous and include wireless communications, medical devices, and instrumentation.

SUMMARY

According to an example embodiment, a frequency divider circuit may comprise a first divider chain including at least one first divider cell and a second divider chain coupled to the first divider chain to form an extendable divider chain. The second divider chain may include at least one second divider cell with a respective reset control. An effective length of the extendable divider chain may be altered, dynamically, via the respective reset control.

The frequency divider circuit may be configured to receive an input frequency signal with an input frequency and generate a divided output frequency signal with a divided output frequency that is a function of the input frequency and a division ratio. The effective length of the extendable divider chain may be a total number of divider cells in the extendable divider chain that influence the division ratio.

The frequency divider circuit may be configured to receive an input frequency signal and generate a divided output frequency signal. The frequency divider circuit may further comprise an output frequency generator circuit. The output frequency generator circuit may be configured to perform a logical NOR of each output modulus signal generated by the first divider chain to generate the divided output frequency signal.

The frequency divider circuit may be further configured to receive a set of division ratio control signals. Each of the at least one first and second divider cells may be configured to receive a respective programming input signal for controlling a respective division mode of the at least one first and second divider cells. The frequency divider circuit may further comprise a division ratio update circuit. The division ratio update circuit may be configured to update each respective programming input signal to a respective division ratio control signal of the set of division ratio control signals in response to a rising edge of the divided output frequency signal.

The frequency divider circuit may further comprise a length altering circuit. The length altering circuit may be configured to alter, dynamically, the effective length of the extendable divider in response to a rising edge of the divided output frequency signal.

The frequency divider circuit may further comprise a reset generator circuit configured to generate a respective reset control signal for controlling the respective reset control of each at least one second divider cell. The reset generator circuit may be further configured to update a respective state of the respective reset control signal in response to a falling edge of the divided output frequency signal.

The respective reset control signal may be configured to be a function of at least one respective programming input signal received for controlling the respective division mode of the at least one second divider cell.

Each at least one second divider cell may be configured to generate a respective modulus output signal and to set the respective modulus output signal to an active level in an event the respective reset control is asserted.

The frequency divider circuit may be employed by a fractional-N phase-locked loop (frac-N PLL). The frac-N PLL may be configured to be in a non-reset state throughout a dynamic change to the effective length of the extendable divider chain.

Each first divider cell of the at least one first divider cell may be a 2/3 divider cell and each second divider cell of the at least one second divider cell may be a resettable 2/3 divider cell.

According to another example embodiment, a method for performing frequency division by a frequency divider circuit may comprise employing a first divider chain including at least one first divider cell. The method may comprise coupling the first divider chain to a second divider chain to form an extendable divider chain. The second divider chain may include at least one second divider cell with a respective reset control. The method may comprise altering an effective length of the extendable divider chain, dynamically, via the respective reset control, enabling the frequency divider circuit to alter, dynamically, the frequency division performed.

The method may comprise receiving an input frequency signal with an input frequency and generating a divided output frequency signal with a divided output frequency that is a function of the input frequency and a division ratio. The effective length of the extendable divider chain may be a total number of divider cells in the extendable divider chain that influence the division ratio.

The method may comprise receiving an input frequency signal with an input frequency, generating a divided output frequency signal with a divided output frequency, and performing a logical NOR of each output modulus signal generated by the first divider chain to generate the divided output frequency signal.

The method may comprise receiving a set of division ratio control signals, receiving a respective programming input signal for controlling a respective division mode of the at least one first and second divider cells, and updating each respective programming input signal to a respective division ratio control signal of the set of division ratio control signals in response to a rising edge of the divided output frequency signal.

Altering the effective length may be performed in response to a rising edge of the divided output frequency signal.

The method may comprise generating a respective reset control signal for controlling a respective reset control of each at least one second divider cell and updating a respective state of the respective reset control in response to a falling edge of the divided output frequency signal.

The respective reset control signal may be a function of at least one respective programming input signal received for controlling the respective division mode of the at least one second divider cell.

The method may comprise generating, by each at least one second divider cell, a respective modulus output signal and setting the respective modulus output signal to an active level in an event the respective reset control is asserted.

The method may comprise employing the frequency divider circuit by a fractional-N phase-locked loop (frac-N PLL) and maintaining the frac-N PLL in a non-reset state throughout a dynamic change to the effective length of the extendable divider chain.

It should be understood that example embodiments disclosed herein can be implemented in the form of a method, apparatus, or system.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION

A description of example embodiments of the invention follows.

A basic building block of a phase-locked loop (PLL) is a feedback divider (N-divider) circuit, also referred to interchangeably herein as a frequency divider. When the feedback divider assumes integer values for N, the PLL is called an integer-N PLL, and when non-integer values are assumed, the PLL is called a fractional-N (frac-N) PLL. The frac-N PLL may lock faster when compared to a similar integer-N PLL because a lower value of N accommodated by the frac-N PLL allows a wider loop filter bandwidth which, in turn, may allow a faster lock time.

Figure 1:
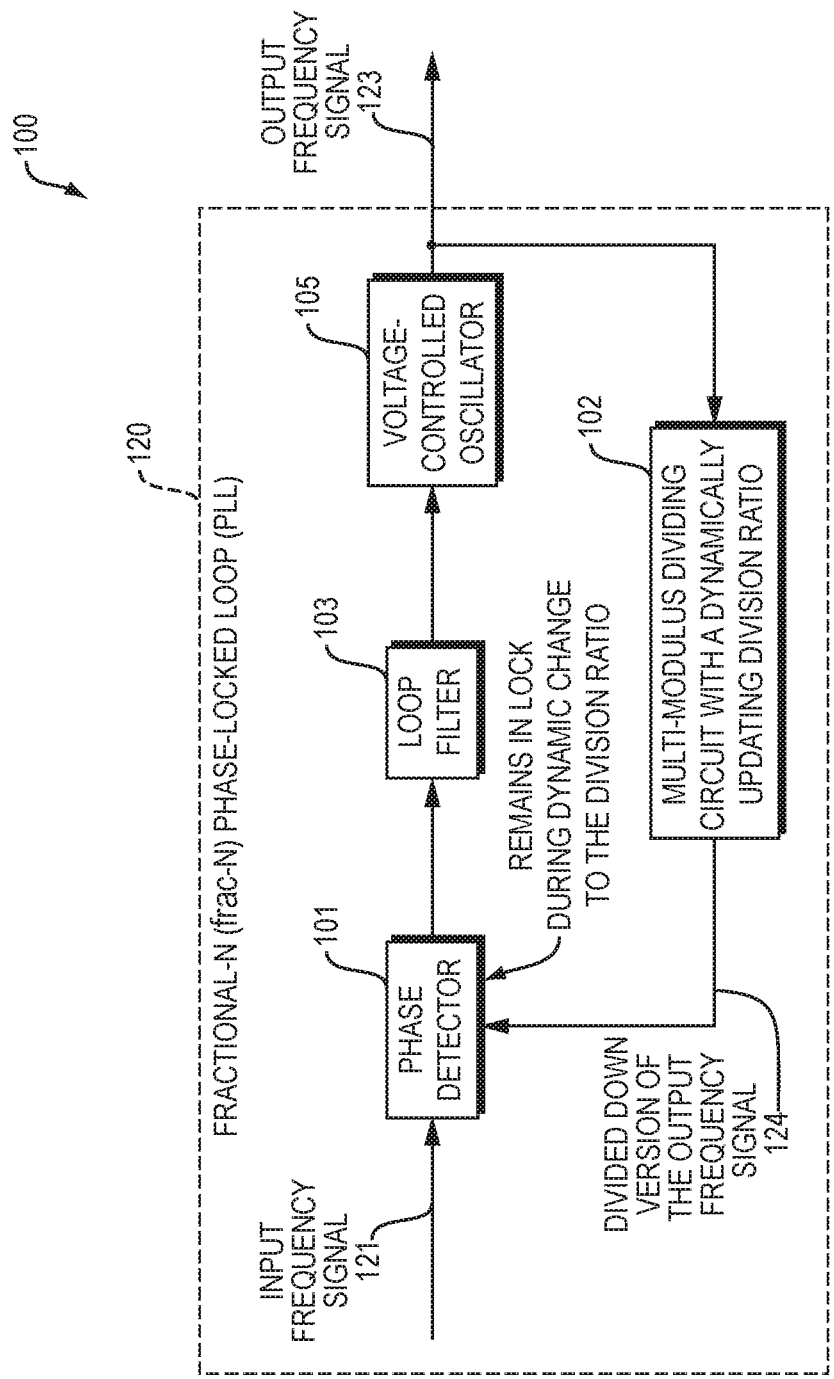
FIG. 1 is a block diagram of an example fractional-N (frac-N) phase-locked loop (PLL) optionally within an embodiment disclosed herein.

FIG. 1 is a block diagram 100 of an example frac-N PLL 120 optionally within an embodiment disclosed herein. The frac-N PLL 120 includes a phase detector 101, loop filter 103, and voltage controlled oscillator (VCO) 105. The VCO 105 generates an output frequency signal 123 which has a frequency proportional to a voltage at an input to the VCO 105. The phase detector 101 may measure a phase difference between an input frequency signal 121 and a divided down version of the output frequency signal 124. The loop filter 103 may be employed to prevent unwanted spurious noise that may be generated by the phase detector 101 from being superimposed on a control voltage to the VCO 105. According to an example embodiment, the non-integer value of N may be changed, dynamically, during a locked state of the frac-N PLL 120.

According to an example embodiment, the frac-N PLL 120 may employ a multi-modulus dividing circuit with a dynamically updating division ratio 102 to divide down the output frequency signal 123. Example embodiments of the multi-modulus dividing circuit with the dynamically updating division ratio 102 are disclosed further below with reference to FIG. 2 and FIG. 6. The frac-N PLL 120 may be implemented in any suitable manner, such as an integrated circuit (IC).

Figure 2:
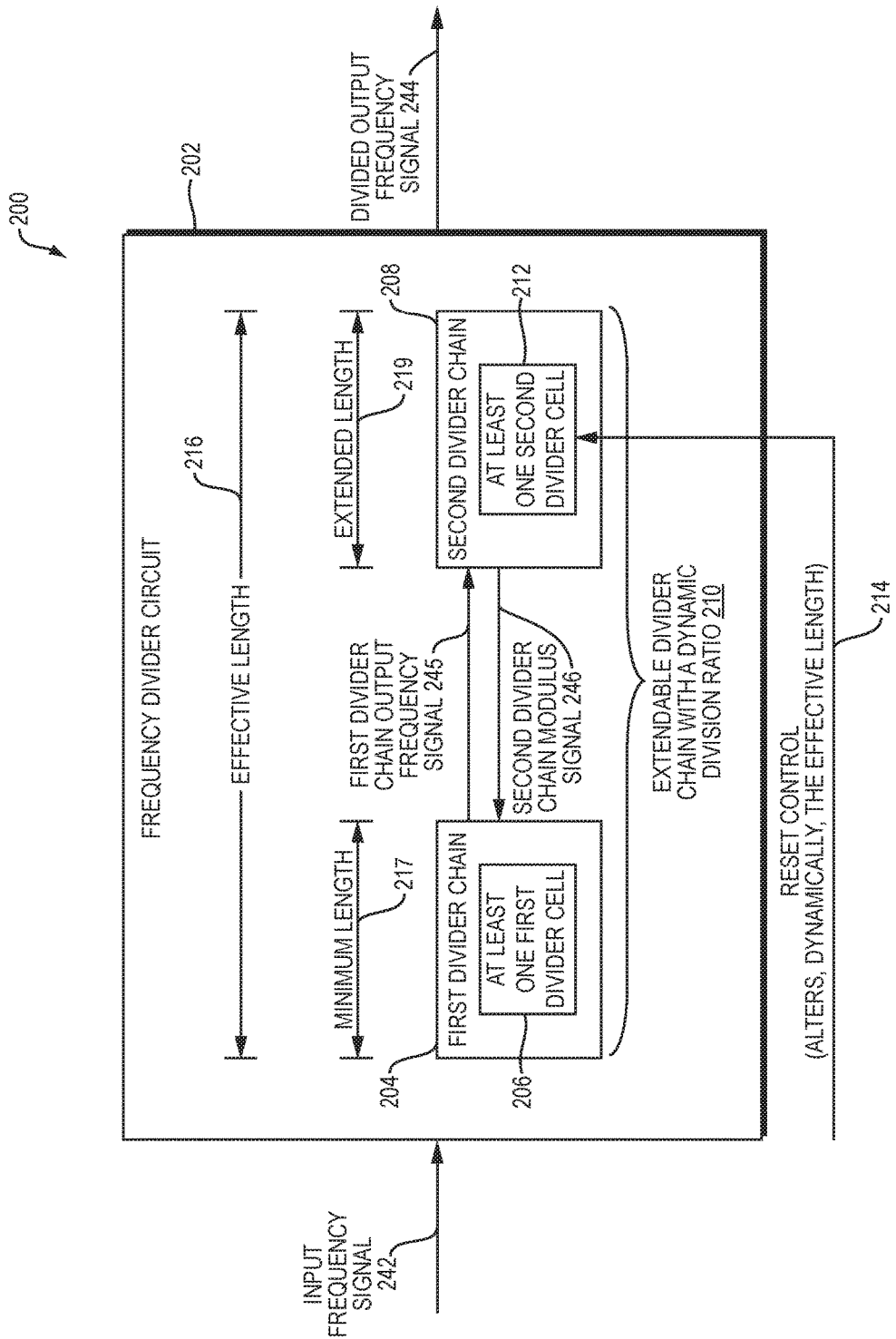
FIG. 2 is a block diagram of an example embodiment of a frequency divider circuit.

FIG. 2 is a block diagram 200 of an example embodiment of a frequency divider circuit 202. The frequency divider circuit 202 may be a multi-modulus divider circuit configured to receive an input frequency signal 242 and to generate a divided output frequency signal 244. The frequency divider circuit 202 may comprise a first divider chain 204 including at least one first divider cell 206 and a second divider chain 208 that may be coupled to the first divider chain 204 to form an extendable divider chain with a dynamic division ratio 210. The first divider chain 204 and the second divider chain 208 may be coupled.

For example, the first divider chain 204 and the second divider chain 208 may be coupled via a first divider chain output frequency signal 245 that may be output from an endmost first divider cell (not shown) of the first divider chain 204 that may be input to a starting second divider cell (not shown) of the second divider chain 208. The first divider chain 204 and the second divider chain 208 may be further coupled via a second divider chain modulus signal 246 that may be output from the starting second divider of the second divider chain 208 cell and input to the endmost first divider cell of the first divider chain 204.

The second divider chain 208 may include at least one second divider cell 212 with a respective reset control 214. An effective length 216 of the extendable divider chain 210 may be altered, dynamically, via the respective reset control 214. The effective length 216 of the extendable divider chain may be a total number of divider cells in the extendable divider chain that influence the division ratio. The effective length 216 may be a sum of a minimum length 217 and an extended length 219. The minimum length 217 may be a first total number of first divider cells that compose the first divider chain 204 as each at least one first divider cell 206 may influence the division ration. The extended length 219 may be a second total number of second divider cells of the second divider chain 208 that actively influence the division ratio based on a respective state of the respective reset control 214.

According to an example embodiment, each first divider cell of the at least one first divider cell 206 may be a 2/3 divider cell, such as the 2/3 divider cell of FIG. 4, disclosed further below. Each second divider cell of the at least one second divider cell 212 may be a resettable 2/3 divider cell, such as the resettable 2/3 divider cell of FIG. 12, disclosed further below.

The frequency divider circuit 202 may be employed by a frac-N PLL (not shown), such as the frac-N PLL 120 of FIG. 1, disclosed above. For example, the input frequency signal 242 may be the output frequency signal 123 that is output from the VCO 105 of FIG. 1 and the divided output frequency signal 244 may be input to the phase detector 101 for comparison with an input frequency signal, such as the input frequency signal 121 of FIG. 1, disclosed above.

The frac-N PLL 120 may be configured to be in a non-reset state throughout a dynamic change to the effective length 216 of the extendable divider chain 210. For example, the frac-N PLL 120 may be able to maintain a locked state even though the dynamic change to the effective length 216 is made. As such, the frequency divider circuit 202 may be employed by applications, such as a frac-N PLL application, that may require dynamic changes to the division ratio with no adverse effect, such as no loss of lock of the frac-N PLL. Thus, the frequency divider circuit 202 provides an advantage over other frequency divider circuits that may have a limited range or a range that, while programmable, may be a statically programmable range, such as the prior art frequency divider circuits of FIG. 3 and FIG. 5, disclosed below.

Figure 3:
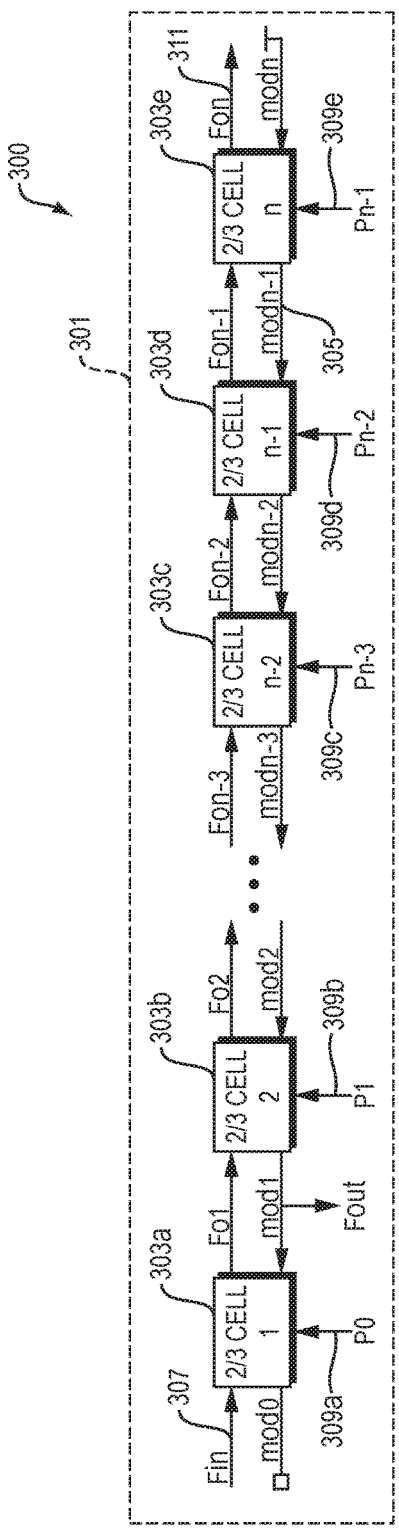
FIG. 3 is a circuit diagram of a prior art programmable prescaler.

FIG. 3 is a circuit diagram 300 of a prior art frequency divider circuit, that is, the programmable prescaler 301. The programmable prescaler 301 includes a chain of 2/3 divider cells 303a-e. Each 2/3 divider cell of the 2/3 divider cells 303a-e divides by either 2 or 3, as disclosed with reference to FIG. 4, disclosed below.

Figure 4:
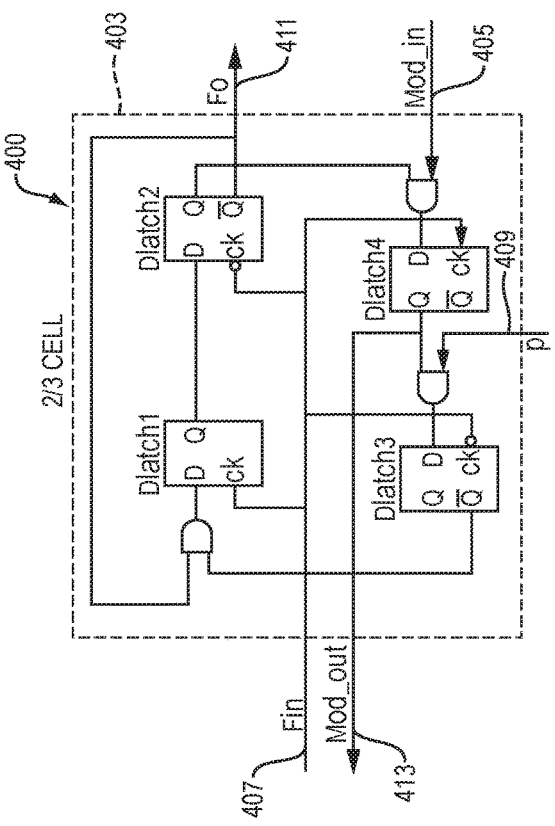
FIG. 4 is a circuit diagram of a prior art 2/3 divider cell.

FIG. 4 is a circuit diagram 400 of a prior art 2/3 divider cell 403. The 2/3 divider cell 403 divides a frequency of an input frequency signal 407, that is, $F_{in}$, either by 2 or by 3, and outputs the divided clock signal 411, that is, $F_o$, to a next cell (not shown) in a chain (not shown). A momentaneous division ratio of the 2/3 divider cell 403 may be based on a state of a modulus input signal 405, also referred to interchangeably herein as a "mod_in" signal 405, and a programming input signal 409, also referred to interchangeably herein as the "p" input signal 409. The mod_in signal 405 becomes active once in a division cycle. At that moment, a state of the p input signal 409 is checked.

If p==1, the 2/3 divider cell 403 is forced to swallow one extra period of the input frequency signal 407. In other words, the 2/3 divider cell 403 divides by 3. If, however, p==0, the 2/3 divider cell 403 stays in division by 2 mode. Regardless of the state of the p input signal 409, the mod_in signal 405 is re-clocked and the re-clocked version is output as the modulus output signal 413, also referred to interchangeably herein as the mod_out signal 413, that may be output to a preceding cell (not shown) in the chain (not shown).

Turning back to FIG. 3, the programmable prescaler 301 operates as follows. Once in a division period, a last cell on the chain (also referred to interchangeably herein as an endmost cell), that is, the 2/3 divider cell 303e of the chain of 2/3 divider cells 303a-e, generates the modulus input signal 305, that is, $mod_{n-1}$. The modulus input signal 305 then propagates "up" the chain, being re-clocked by each cell along the way. An active modulus input signal enables a cell to divide by 3 (once in a division cycle), provided that its programming input signal p is set to 1, as disclosed above with reference to FIG. 4. Division by 3 adds one extra period of each cell's input signal to a period of the divided clock signal 311, that is, $F_o$, to control the division ratio applied to the input frequency signal 307 (i.e., $F_{in}$).

In FIG. 3, the programming input signals 309a-e (i.e., $p_0, \ldots, p_{n-1}$) are the binary programming values of the cells 1 to n, respectively. As such, integer division ratios ranging from $2^n$ (if all $p_n=0$) to $2^{n+1}-1$ (if all $p_n=1$) may be realized. A division range of the programmable prescaler 301 may be considered rather limited as the division range amounts to roughly a factor of two between maximum and minimum division ratios. Such a division range may be expanded to achieve a smaller division number, such as disclosed below with reference to FIG. 5.

Figure 5:
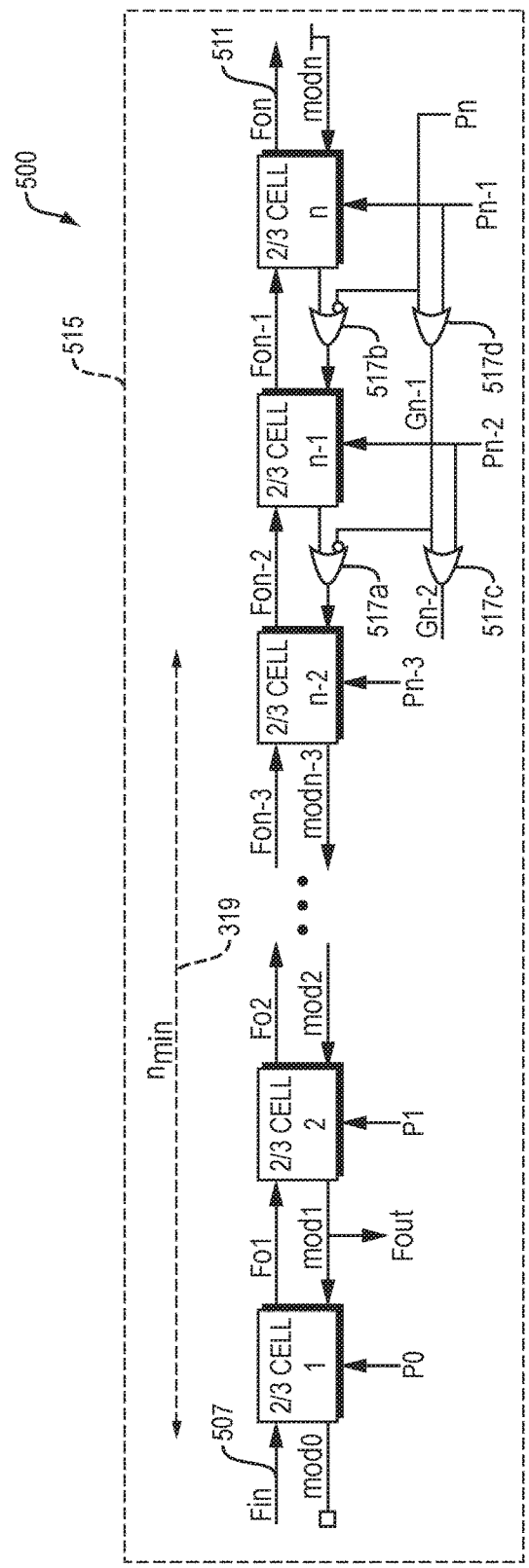
FIG. 5 is a circuit diagram of a prior art programmable prescaler with extended range.

FIG. 5 is a circuit diagram 500 of a prior art programmable prescaler 515 with extended range. The divider implementation of FIG. 5 extends the division range of the prescaler of FIG. 3, disclosed above. The operation of the programmable prescaler 515 with extended range may be based on a direct relationship between a performed division ratio and a bus programmed division word $p_n, p_{n-1}, \ldots, p_1, p_0$. An effective length n' of the chain may be a total number of divider cells that are effectively influencing the division cycle.

For example, by deliberately setting a modulus input signal, that is, a mod input of a particular 2/3 cell, to an active level overrules an influence of all cells to the right of that particular cell. As such, the divider chain behaves as if it has been shortened. The effective length n' may correspond to an index of a most significant (and active) bit of the programmed division word $p_n, p_{n-1}, \ldots, p_1, p_0$. In the programmable prescaler 515, the OR gates 517a-d are employed to adapt n' to the programmed division word.

By employing the additional logic, that is, the OR gates 517a-d, and signals $p_n, G_{n-1}, G_{n-2}$, etc. for controlling modulus input control signals, the division range becomes:

minimum division ratio: $2^{n'min}$
maximum division ratio: $2^{n'+1}-1$.

The minimum and maximum division ratios may be set, independently, by choice of $n'_{min}$ 319 and n, respectively, where n corresponds to a total number of 2/3 cells in the chain and $n'_{min}$ 319 corresponds to a minimum number of 2/3 cells that always influence the division ratio for producing the divided clock signal 511 (i.e., $F_o$) from the input signal 507 (i.e., $F_{in}$).

The programmable prescaler 515 with extended range may be employed for applications in which a statically programmed division ratio is acceptable; however, such a design does not enable the division ratio to be changed, dynamically, as may be needed by applications, such as the frac-N PLL 120 of FIG. 1, disclosed above.

Although the programmable prescaler 515 with extended range appears to cover from $2^{n'min}$ to $2^{n'+1}-1$, dynamic changes to the effective length n' may result in errors, such as the errors 1376 of FIG. 13, disclosed further below. An example embodiment disclosed herein enables such a dynamic change to the effective length n' while the frac-N PLL maintains lock because no errors are introduced as a result of the dynamic change, as shown in FIG. 14, disclosed further below.

Figures 6, 7:
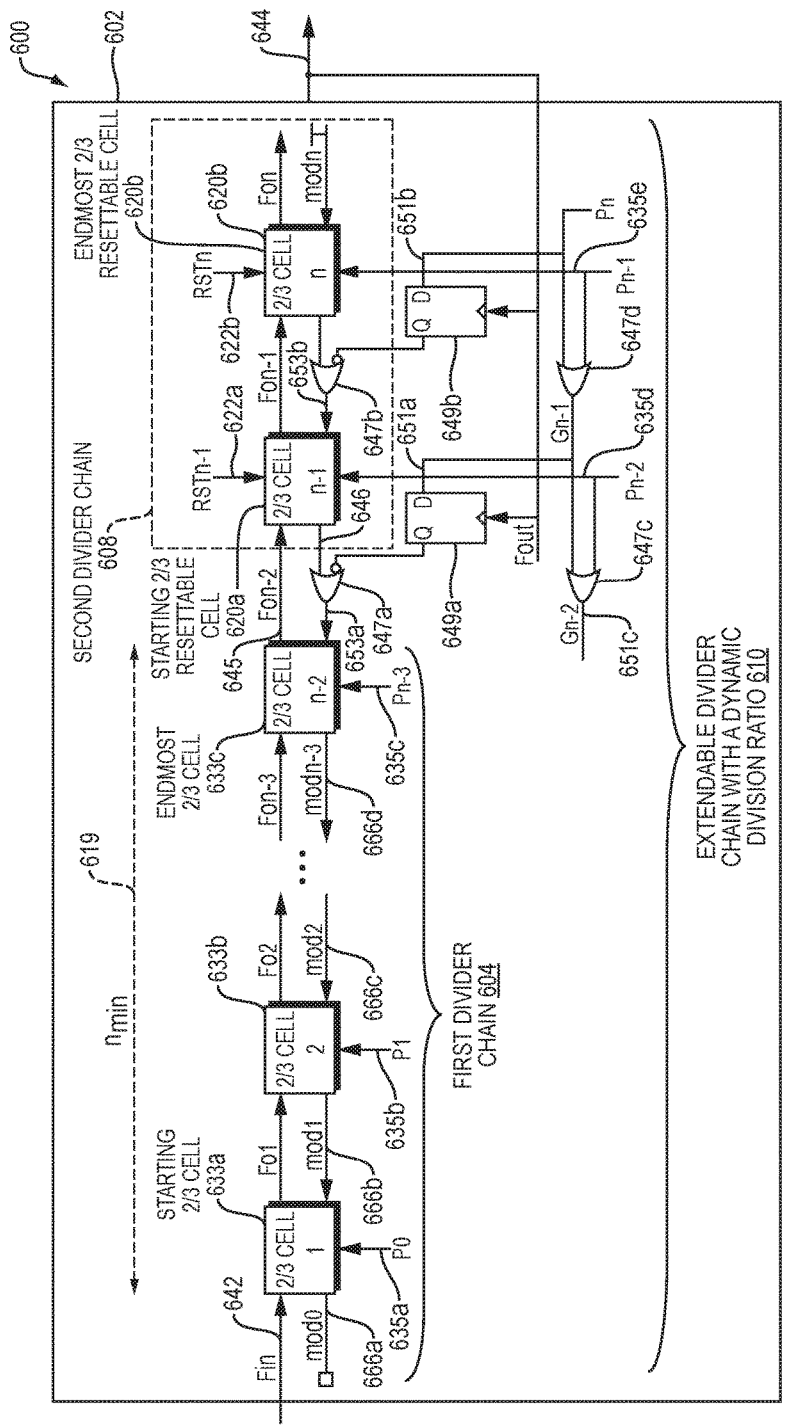
FIG. 6 is a circuit diagram of an example embodiment of a frequency divider circuit.
FIG. 7 is a circuit diagram of an example embodiment of an output frequency generator circuit.

FIG. 6 is a circuit diagram 600 of an example embodiment of a frequency divider circuit 602 that may be an example embodiment of a multi-modulus divider circuit, such as the frequency divider circuit 202 of FIG. 2, disclosed above.

The frequency divider circuit 602 comprises a first divider chain 604 that includes at least one first divider cell, for example, $n_{min}$ 619 first divider cells including the first divider cells 633a-c, in the example embodiment. The $n_{min}$ 619 first divider cells that include the first divider cells 633a-c may be any suitable number $n_{min}$ 619 of first divider cells that always influence the division ratio.

The frequency divider circuit 602 comprises a second divider chain 608 that may be coupled to the first divider chain 604 to form an extendable divider chain 610. For example, the first divider chain 604 and the second divider chain 608 may be coupled via the divided frequency output signal 645 (i.e., $F_{On-2}$) that may be output from the endmost first divider cell 633c of the first divider chain 604 and input to the starting second divider cell 622a of the second divider chain 608. The first divider chain 604 and the second divider chain 608 may be further coupled via the second divider chain modulus signal 646 that may be gated via the OR gate 647a of the OR gates 647a-d and input to the endmost first divider cell 633c. It should be understood that the number of the first and second divider cells of FIG. 6 are shown for illustrative purposes and that the first and second divider chains may be composed of an suitable number of first and second divider cells.

The second divider chain 608 may include at least one second divider cell with a respective reset control, such as the second divider cells 620a and 620b with reset control 622a and 622b, respectively. An effective length n' of the extendable divider chain 610 may be altered, dynamically, via the respective reset control, that is 622a and 622b, in the example embodiment.

For example, the second divider cells 620a and 620b may be 2/3 cells with resettable latches, as disclosed with reference to FIG. 12, further below. By forcing an output modulus signal of a given second divider cell to an active state via the respective reset control, any second divider cell to the right of the given second divider cell may not influence the division ratio, effectively shortening the chain. Further, a length altering circuit may be employed in addition to the respective reset control to override the output modulus signal of the given second divider cell such that an inactive state is overridden such that an active state is propagated to a preceding cell instead, effectively shortening the chain.

For example, the frequency divider circuit 602 may further comprise a length altering circuit. The length altering circuit may be composed of the OR gates 647a-d and the latches (i.e., flip-flops) 649a and 649b. The length altering circuit may be configured to alter, dynamically, the effective length of the extendable divider chain 610 in response to a rising edge of the divided output frequency signal 644. For example, each of the latches 649a and 649b may be configured to update a respective gating signal 651a or 651b in response to the rising edge of the divided output frequency signal 644.

Each gating signal may be a function of one or more programming input signals and a latched version of each gating signal may be inverted and input to a respective OR gate of the OR gates 647a or 647b for setting a modulus signal 653a or 653b to an active state to shorten the effective length. Updating the effective length with the rising edge of the divided output frequency signal 644 introduces an extra delay between a division number update and a divider length change, enabling such a dynamic change to be made without error, as shown in FIG. 14, disclosed further below. The divided output frequency signal 644 may be generated via an output frequency generator circuit, such as the output frequency generator circuit 752 of FIG. 7, disclosed further below.

Turning back to FIG. 6, the frequency divider circuit 602 may be configured to receive an input frequency signal 642 with an input frequency and to generate a divided output frequency signal 644 with a divided output frequency that is a function of the input frequency and a division ratio. The effective length of the extendable divider chain may be a total number of divider cells in the extendable divider chain that influence the division ratio. The frequency divider circuit 602 may be an asynchronous divider circuit that achieves reliable operation with a dynamically updating division ratio.

Each of the at least one first and second divider cells, such as the first divider cells 633a-c and second divider cells 620a and 620b, may be configured to receive a respective programming input signal, such as the programming input signals 635a-e for controlling a respective division mode of the at least one first and second divider cells. Gating signals, such as the gating signal 651a (i.e., $G_{n-1}$) and the gating signal 651c (i.e., $G_{n-2}$), may be generated from a subset of the programming input signals 635a-e, such as the subset $p_n$, $p_{n-1}$, and $p_{n-2}$, and employed to control states of modulus input control signals propagating along the chain.

FIG. 7 is a circuit diagram 750 of an example embodiment of an output frequency generator circuit 752 for generating a divided output frequency signal 744, such as the divided output frequency signal 644 of FIG. 6, disclosed above. The frequency divider circuit 602 may further comprise the output frequency generator circuit 752. The output frequency generator circuit 752 may be configured to perform a logical NOR of each output modulus signal generated by the first divider chain 604 to generate the divided output frequency signal 744 (i.e., $F_{out}$).

For example, the output frequency generator circuit 752 may include a NOR gate 734 that may be configured to perform a logical NOR of the modulus signals 766a-d that may each be generated by a first divider chain, such as the modulus signals 666a-d (i.e., mod0, mod1, mod2, . . . , modn−3) of FIG. 6, disclosed above.

By performing a NOR operation of all the modulus signals from the $n_{min}$ 619 cells of the first divider chain 604, none of which are not affected by the divider chain shortening method, and employing a result from such a NOR operation both as the divided output (i.e., $F_{out}$) and as a clock for synchronizing the dynamic change of the division ratio, the divided output frequency signal 644 that is generated has negligible jitter. Since the modulus signal 666a of a starting first divider cell 633a of the first divider chain 604 (i.e., mod0) is used, the divided output frequency signal 644 (i.e., $F_{out}$) is gated directly by the input frequency signal 642 and, thus, has negligible jitter. Also, a combined pulse width of the divided output frequency signal 644 (i.e., $F_{out}$) is much wider relative to a pulse width of the modulus signal 666a (i.e., mod0), alone, as shown with reference to FIG. 8, disclosed below.

Figure 8:
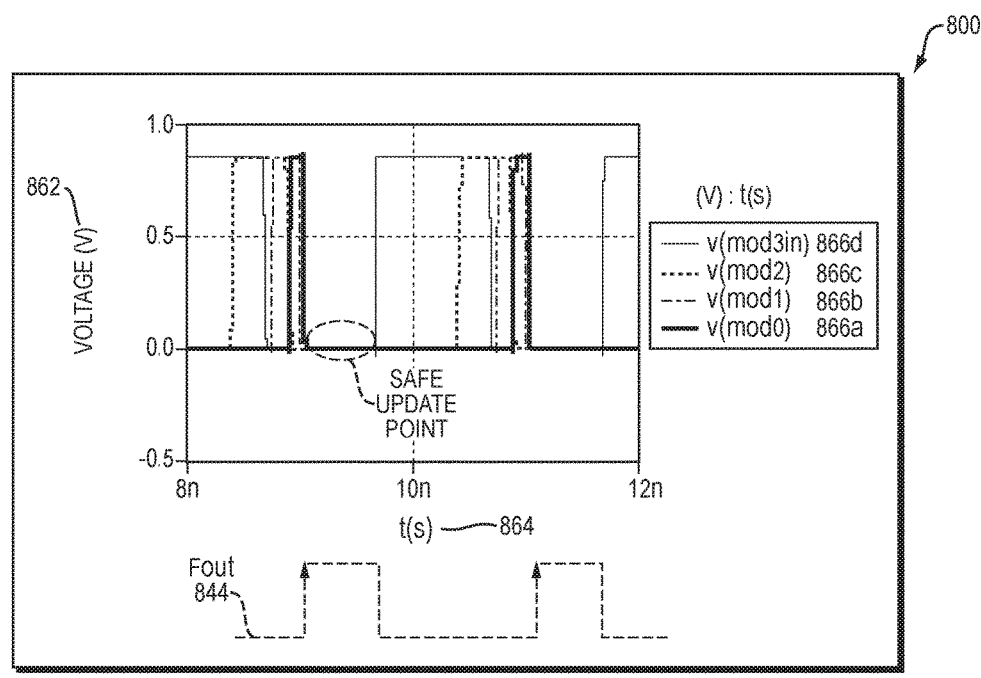
FIG. 8 is a graph of an example embodiment of modulus signals and a divided output frequency signal generated according to the example embodiment of FIG. 7.

FIG. 8 is a graph 800 of an example embodiment of voltage 862 over time 864 for modulus signals 866a-d generated by a first divider chain, such as the modulus signals 666a-d of FIG. 6 generated by the first divider chain 604, and a divided output frequency signal $F_{out}$ 844 generated according to the example embodiment of FIG. 7, disclosed above. As shown in the graph 800, a pulse width of the modulus signals 866a-d may become narrower as a modulus number, such as 3, 2, 1, and 0, in the example embodiment, becomes smaller. However, an overlap between any two adjacent modulus signals, such as an overlap between the modulus signal 866a (i.e., mod0) and the modulus signal 866b (i.e., mod1), or an overlap between the modulus signal 866b (i.e., mod1) and the modulus signal 866c (i.e., mod2), etc., is present.

Thus, there is no glitch in the divided output frequency signal $F_{out}$ 844 that may be generated by combining multiple modulus signals using a logical NOR gate, such as the logical NOR gate 734 of FIG. 7, disclosed above. Further, as shown in the graph 800, at a falling edge of the modulus signal 866a (i.e., mod0), it is safe to update the division numbers $p_0$-$p_n$ without disrupting a normal propagation of the modulus signals when each of the modulus signals are zero.

Figure 9:
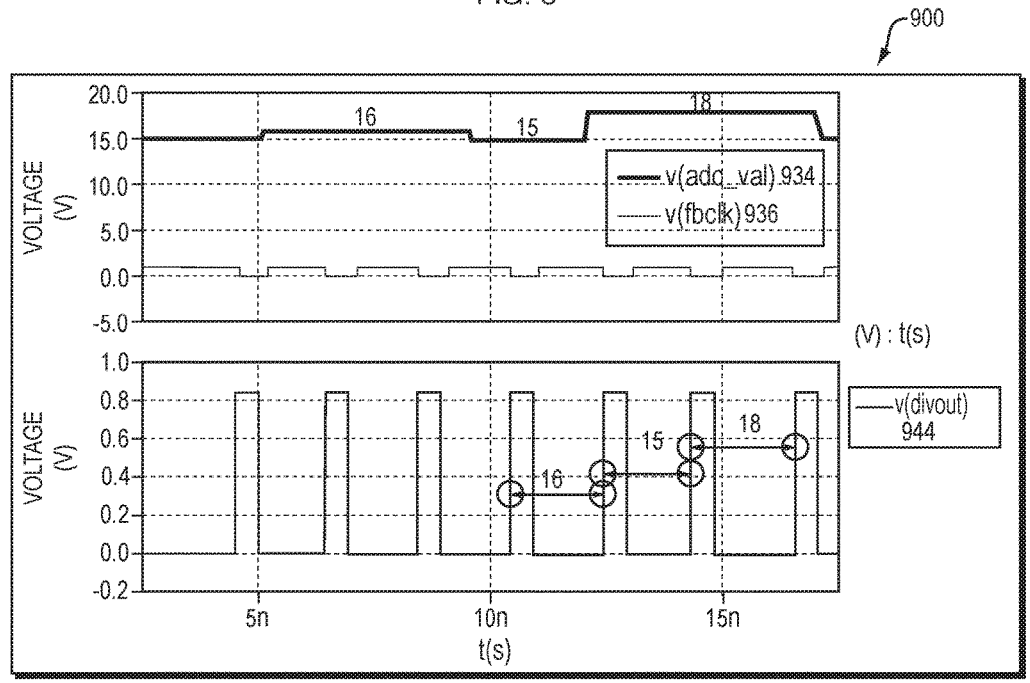
FIG. 9 is a graph of an example embodiment of a divided output frequency signal.

FIG. 9 is a graph 900 of an example embodiment of a divided output frequency signal. The graph 900 shows that a divided output frequency signal 944 that may be generated based on an example embodiment disclosed herein yields an expected division ratio according to controlling division inputs 934 and 936.

Turning back to FIG. 6, the frequency divider circuit 602 may be further configured to receive a set of division ratio control signals (not shown), such as the set of division ratio control signals 1081 of FIG. 10, disclosed below. The frequency divider circuit 602 may further comprise a division ratio update circuit (not shown), such as the division ratio update circuit 1080 of FIG. 10.

Figure 10:
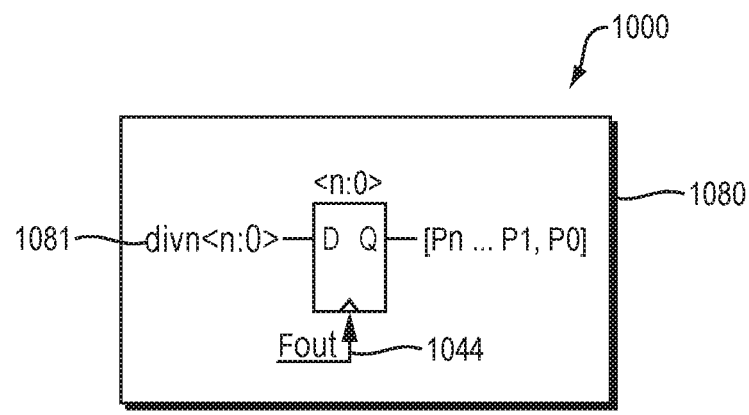
FIG. 10 is a circuit diagram of an example embodiment of a division ratio update circuit.

FIG. 10 is a circuit diagram 1000 of an example embodiment of the division ratio update circuit 1080. As disclosed in FIG. 6, above, each of the at least one first and second divider cells, that is, each of the at least one first divider cells 633a-c and the at least one second divider cells 620a and 620b, may be configured to receive a respective programming input signal for controlling a respective division mode of the at least one first and second divider cells, such as the programming input signals 635a-e. The division ratio update circuit 1080 may be configured to update each respective programming input signal of the at least one and second divider cells, such as the respective programming input signals 635a-e, to a respective division ratio control signal of the set of division ratio control signals 1081. The respective programming input signals 635a-e may be updated to a respective division ratio control signal of the set of division ratio control signals 1081 in response to a rising edge of the divided output frequency signal 644 that may be generated according to the example embodiment of FIG. 7, disclosed above.

Turning back to FIG. 6, the frequency divider circuit 602 may further comprise a reset generator circuit configured to generate a respective reset control signal for controlling the respective reset control of each at least one second divider cell. The reset generator circuit may be further configured to update a respective state of the respective reset control signal in response to a falling edge of the divided output frequency signal as disclosed with reference to FIG. 11, below.

Figure 11:
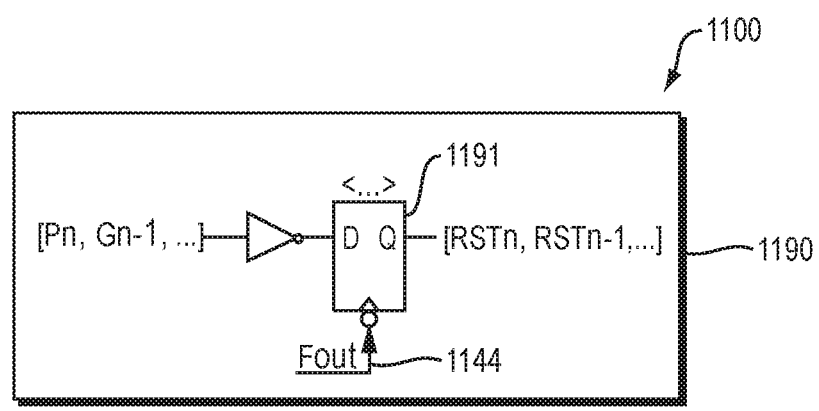
FIG. 11 is a circuit diagram of an example embodiment of a reset generator circuit.

FIG. 11 is a circuit diagram 1100 of an example embodiment of a reset generator circuit 1190. The reset generator circuit 1190 may be configured to update reset signals for the dynamic cells, that is, each second divider cell of the at least one second divider cell of the second divider chain 608, with a falling edge of $F_{out}$ 1144, that may be generated according to the example embodiment of FIG. 7, disclosed above.

The respective reset control signal, such as the reset control 622a and 622b of FIG. 6, disclosed above, may be configured to be a function of at least one respective programming input signal received for controlling the respective division mode of the at least one second divider cell. Each at least one second divider cell, such as the second divider cells 620a and 620b may be configured to generate a respective modulus output signal and to set the respective modulus output signal to an active level in an event the respective reset control is asserted. Each of the second divider cells 620a and 620b may be resettable 2/3 divider cells, as disclosed with reference to FIG. 12 below. The reset generator circuit 1190 may include a plurality of latches 1191 each receiving an inverted form of a respective programming input signal and each clocked via the falling edge of $F_{out}$ 1144 to generate a respective reset control. It should be understood that receiving an inverted form of a respective programming input signal may include inverting the respective programming input signal via an inverter at a respective input to the latch or via employing the latch's inverted output (i.e., /Q) as the respective reset control.

Figure 12:
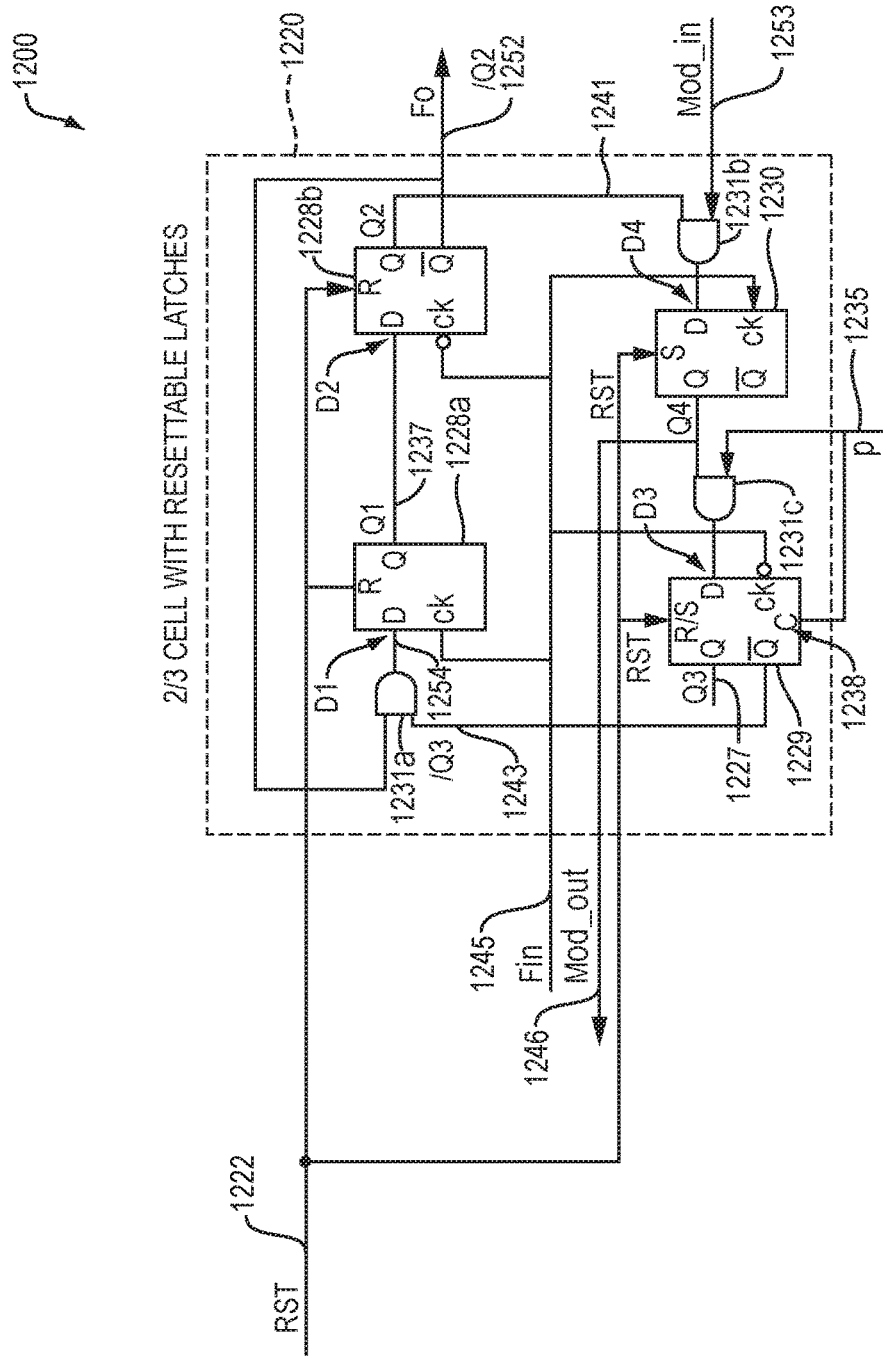
FIG. 12 is a circuit diagram of an example embodiment of a resettable 2/3 divider cell.

FIG. 12 is a circuit diagram 1200 of an example embodiment of a resettable 2/3 divider cell 1220. The resettable 2/3 divider cell 1220 may be employed as a second divider cell of the second divider chain 208 of FIG. 2 or the second divider chain 608, of FIG. 2 and FIG. 6, respectively, disclosed above. The resettable 2/3 divider cell 1220 may be composed of a first resettable latch 1228a with an output Q1 1237 that may be coupled to an input D2 of a second resettable latch 1228b. The 2/3 resettable divider cell 1220 may be further composed of a set/reset latch 1229, a settable latch 1230, a first AND gate 1231a, a second AND gate 1231b, and a third AND gate 1231c.

An input frequency signal 1245, that may be output from a preceding 2/3 cell, may be employed as an input clock to the first resettable latch 1228a and the settable latch 1230 while the input frequency signal 1245 in an inverted form may be employed as the input clock to the second resettable latch 1228b and the set/reset latch 1229.

A first inverse output /Q2 1252 from the second resettable latch 1228b may be input to the first AND gate 1231a and combined via a logical AND operation with a second inverse output /Q3 1243 from the set/reset latch 1229 to generate a first input D1 1254 to the first resettable latch 1228a. The first inverse output /Q2 1252 may be employed as the output frequency signal to a next 2/3 resettable divider cell (not shown). A modulus signal 1253 from the next 2/3 resettable divider cell may be combined via a logical AND operation with an output Q2 1241 of the second resettable latch 1228b by the second AND gate 1231b and the result may be input as D4 to the settable latch 1230.

The output Q4 1246 from the settable latch 1230 may be employed as a modulus signal output that is input to a preceding 2/3 divider cell (not shown) that may be a resettable or non-resettable 2/3 divider cell. The output Q4 1246 may be combined via an AND operation with a programming input signal p 1235 by the AND gate 1231c and the output D4 from the AND gate 1231c may be input to the set/reset latch 1229.

According to the example embodiment of FIG. 12, when the reset control signal 1222 input to the resettable 2/3 divider cell 1220 is active, the output Q1 1237 from the first resettable latch 1228a and the output Q2 from the second resettable latch 1228b are both zero, the output Q4 1246, which is the modulus output signal (i.e., mod_out) from the 2/3 resettable latch 1220 is one. Further, the set/reset latch 1229 includes a control C input 1238. In an event the reset control signal 1222 is inactive, the control C input 1238 is ignored. However, in an event the reset control signal 1222 is active, configuring the control C input 1238 to a high level, that is, one, causes the set/reset latch 1229 to be set, that is, the Q3 output 1227 is set to one and the /Q3 output 1243 is zero. If however, the reset control signal 1222 is active and the control C input 1238 is configured to be a low level, that is zero, the Q3 output 1227 is set to zero and the /Q3 output 1243 is one. Thus, in an event the reset control signal 1222 is active, the Q3 output 1227 is the programming input signal p 1235 and the /Q3 output 1243 is an inverse of the programming input signal p 1235, where a high value of the programming input signal p 1235 sets the set/reset latch 1229 and a low value the programming input signal p 1235 resets the set/reset latch 1229.

As disclosed above, the 2/3 resettable latch 1220 may be composed of two latches of a same type, that is, the first resettable latch 1228a and the second resettable latch 1228b that both reset to zero, the settable latch 1230 that resets to one, and the set/reset latch 1229 that may be reset to either one or zero depending upon the programming input signal p 1235 input to the control C input 1238. As such, the resettable 2/3 divider cell 1220 may operate in a same manner as a non-resettable 2/3 cell, such as disclosed with reference to FIG. 4, above, when the reset control signal 1222 is in an inactive state. However, when the reset control signal 1222 is active, the resettable 2/3 divider cell 1220 may generate a modulus output signal, that is, the output Q4 1246, that is active, such that the modulus output signal would prevent further divider cells in the chain from influencing the length of the chain and, thus, the division ratio. Further, the resettable 2/3/ divider 1220 advantageously preserves the internal states of all latches, such as the first resettable latch 1228a, the second resettable latch 1228b, the settable latch 1230, and the set/reset latch 1229, to keep division ratio correct when the divider chain length is increasing.

Embodiments disclosed herein enable a frequency divider circuit with a dynamically updating division ratio. To enable such a dynamic update, an example performs a nor operation of all the modulus signals from the first divider chain, that is, each of the left "nmin" first divider cells of FIG. 6, which are not affected by the divider chain shortening method, and employ a result of such a NOR operation (i.e., $F_{out}$) both as the divided output signal and as a clock for synchronizing the dynamic change to the length. Since mod0 is employed in the NOR operation, $F_{out}$ may be gated directly by the input clock (i.e., $F_{in}$) and, thus, has the smaller jitter. Also, a combined pulse width of $F_{out}$ is much wider than mod0 alone.

To enable the dynamic update, an example embodiment disclosed above updates the division ratio with the rising edge of $F_{out}$. To enable the dynamic update, an example embodiment updates the dynamic length shortening with a rising edge of $F_{out}$, introducing an extra delay between the division number update and the divider length change, ensuring proper division. To enable the dynamic update, an example embodiment disclosed above updates reset signals for the dynamic cells, that is, the second divider cells that may be 2/3 resettable divider cells, with the falling edge of $F_{out}$ to ensure proper reset timing.

Further to enable the dynamic update, an example embodiment of second divider cell may be a resettable 2/3 divider cell with four latches that operate such that when the reset control is active, Q1 and Q2 are 0, Q4 is 1, and Q3 is equal to the p input programming signal, as disclosed above.

Figure 13:
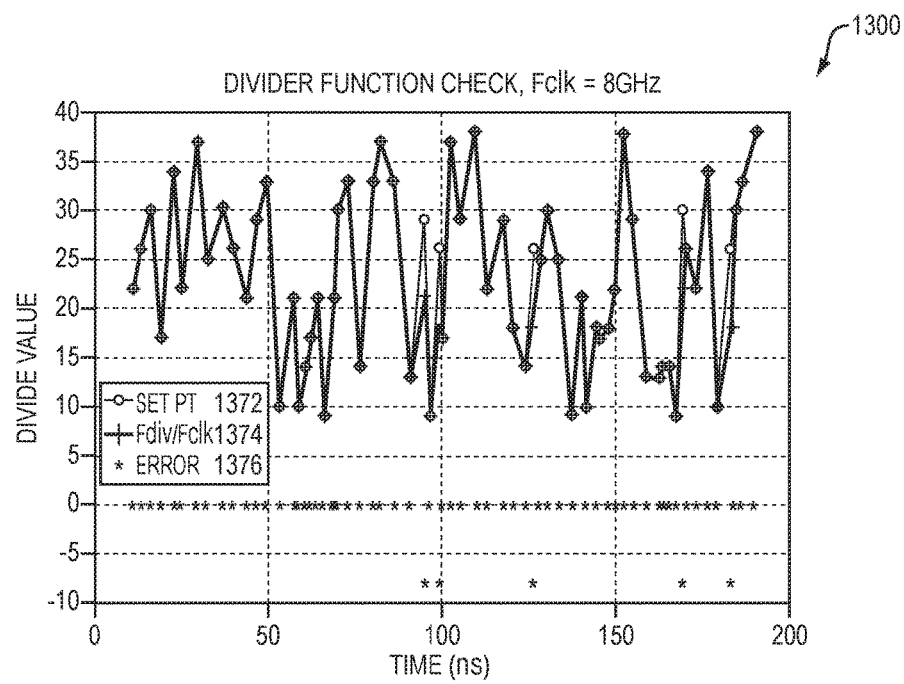
FIG. 13 is a graph showing a correlation between an intended division ratio and an actual division ratio.
Figure 14:
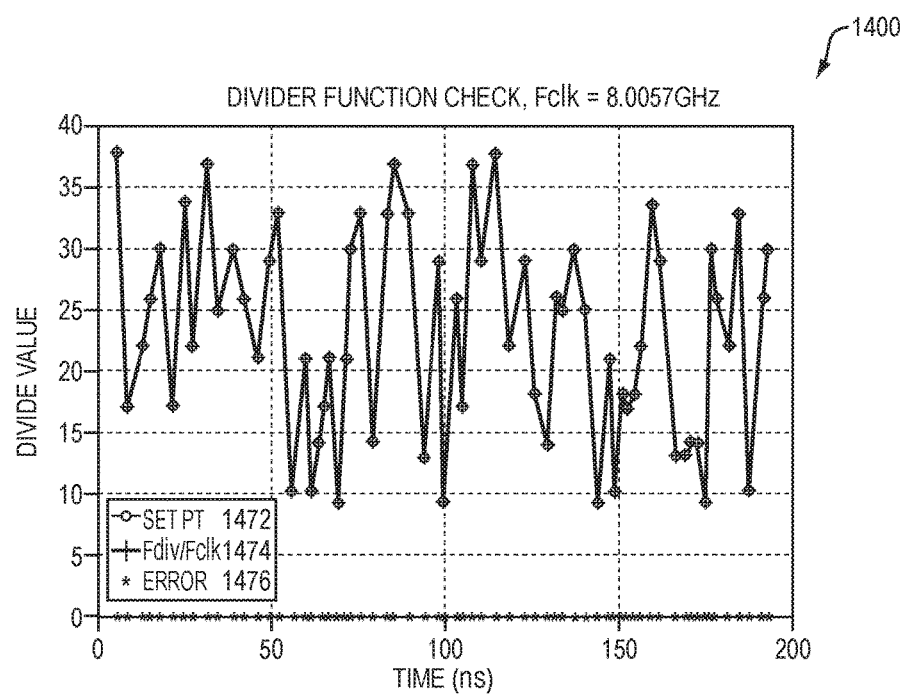
FIG. 14 is a graph showing another correlation between an intended division ratio and an actual division ratio.

FIG. 13 is a graph 1300 showing a correlation between an intended division ratio 1372 and an actual division ratio 1374 achieved via a prior art frequency divider circuit in real time.

FIG. 14 is a graph 1400 showing a correlation between an intended division ratio 1472 and an actual division ratio 1474 achieved via an example embodiment of a frequency divider circuit in real time. The graphs 1300 and 1400 show that the prior art frequency divider circuit generates a division ratio with errors 1376 that include substantive errors, whereas the frequency divider circuit according to the example embodiment yields correct division with no errors 1476.

Figure 15:
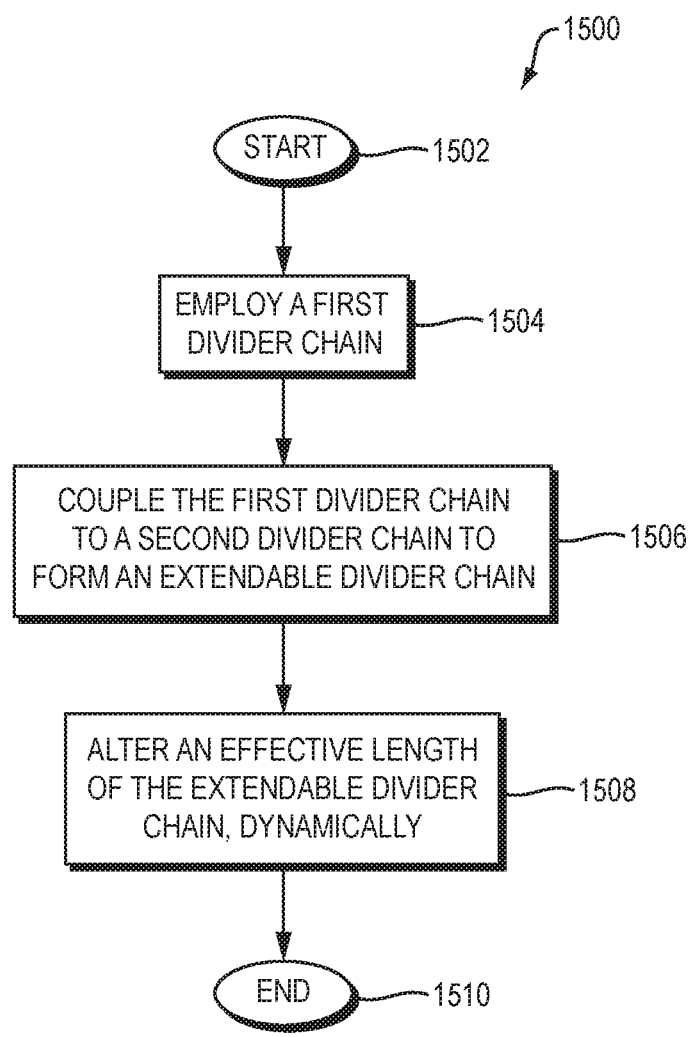
FIG. 15 is a flow diagram of an example embodiment of a method for performing frequency division by a frequency divider circuit.

FIG. 15 is flow diagram 1500 of an example embodiment of a method for performing frequency division by a frequency divider circuit. The method begins (1502) and employs a first divider chain including at least one first divider cell (1504). The method may couple the first divider chain to a second divider chain to form an extendable divider chain (1506). The second divider chain may include at least one second divider cell with a respective reset control. The method may alter an effective length of the extendable divider chain, dynamically, via the respective reset control, enabling the frequency divider circuit to alter, dynamically, the frequency division performed (1508), and the method thereafter ends in the example embodiment (1510).

The teachings of all patents, published applications and references cited herein are incorporated by reference in their entirety.

While this invention has been particularly shown and described with references to example embodiments thereof, it will be understood by those skilled in the art that various changes in form and details may be made therein without departing from the scope of the invention encompassed by the appended claims.

What is claimed is:

1. A frequency divider circuit, the frequency divider circuit comprising:
a first divider circuit including at least one first divider cell;
a second divider circuit coupled to the first divider circuit to form an extendable divider chain, the second divider circuit including at least one second divider cell with a respective reset control, an effective length of the extendable divider chain altered, dynamically, via the respective reset control, wherein the effective length is a total number of divider cells in the extendable divider chain that influence a division ratio of the frequency divider circuit; and
an output frequency generator circuit including a logic gate, the output frequency generator circuit coupled to the first divider circuit, the logic gate configured to generate a divided output frequency signal employed as a clock configured to cause each respective reset control of the at least one second divider cell to be updated, synchronously.

2. The frequency divider circuit of claim 1, wherein the frequency divider circuit is configured to receive an input frequency signal with an input frequency and generate the divided output frequency signal with a divided output frequency that is a function of the input frequency and the division ratio.

3. The frequency divider circuit of claim 1, wherein each at least one first divider cell is configured to generate a respective modulus output signal, and wherein the logic gate is configured to perform a logical NOR of each respective output modulus signal generated by the first divider circuit to generate the divided output frequency signal.

4. The frequency divider circuit of claim 1, wherein the frequency divider circuit is further configured to receive a set of division ratio control signals, each of the at least one first and second divider cells is configured to receive a respective programming input signal for controlling a respective division mode of the at least one first and second divider cells, and wherein the frequency divider circuit further comprises a division ratio update circuit, the division ratio update circuit configured to update each respective programming input signal to a respective division ratio control signal of the set of division ratio control signals in response to a rising edge of the divided output frequency signal.

5. The frequency divider circuit of claim 1, wherein the frequency divider circuit further comprises a length altering circuit and wherein the length altering circuit is configured to alter, dynamically, the effective length of the extendable divider in response to a rising edge of the divided output frequency signal.

6. The frequency divider circuit of claim 1, wherein the frequency divider circuit further comprises a reset generator circuit configured to generate a respective reset control signal for controlling the respective reset control of each at least one second divider cell and wherein the reset generator circuit is further configured to update a respective state of the respective reset control signal in response to a falling edge of the divided output frequency signal.

7. The frequency divider circuit of claim 1, wherein the respective reset control signal is configured to be a function of at least one respective programming input signal received for controlling a respective division mode of the at least one second divider cell.

8. The frequency divider circuit of claim 1, wherein each at least one second divider cell is configured to generate a respective modulus output signal and to set the respective modulus output signal to an active level in an event the respective reset control is asserted.

9. The frequency divider circuit of claim 1, wherein the frequency divider circuit is employed by a fractional-N phase-locked loop (frac-N PLL) and the frac-N PLL is configured to be in a non-reset state throughout a dynamic change to the effective length of the extendable divider chain.

10. The frequency divider circuit of claim 1, wherein each first divider cell of the at least one first divider cell is a 2/3 divider cell and each second divider cell of the at least one second divider cell is a resettable 2/3 divider cell.

11. A method for performing frequency division by a frequency divider circuit, the method comprising:
coupling a first divider circuit including at least one first divider cell to a second divider circuit to form an extendable divider chain, the second divider circuit including at least one second divider cell with a respective reset control;
altering an effective length of the extendable divider chain, dynamically, via the respective reset control, enabling the frequency divider circuit to alter, dynamically, the frequency division performed, wherein the effective length is a total number of divider cells in the extendable divider chain that influence a division ratio of the frequency divider circuit; and
coupling an output frequency generator circuit including a logic gate to the first divider circuit, performing a logical function by the logic gate to generate a divided output frequency signal, and employing the divided output frequency signal as a clock configured to cause each respective reset control of the at least one second divider cell to be updated, synchronously.

12. The method of claim 11, further comprising:
receiving an input frequency signal with an input frequency;
generating the divided output frequency signal with a divided output frequency that is a function of the input frequency and the division ratio.

13. The method of claim 11, further comprising:
generating a respective modulus output signal by each at least one first divider cell;
receiving an input frequency signal with an input frequency;
generating the divided output frequency signal with a divided output frequency; and
wherein performing the logical function includes performing a logical NOR of each respective output modulus signal generated by the first divider circuit to generate the divided output frequency signal.

14. The method of claim 11, further comprising:
receiving a set of division ratio control signals;
receiving a respective programming input signal for controlling a respective division mode of the at least one first and second divider cells; and
updating each respective programming input signal to a respective division ratio control signal of the set of division ratio control signals in response to a rising edge of the divided output frequency signal.

15. The method of claim 11, wherein the altering is performed in response to a rising edge of the divided output frequency signal.

16. The method of claim 11, further comprising:
generating a respective reset control signal for controlling a respective reset control of each at least one second divider cell; and
updating a respective state of the respective reset control signal in response to a falling edge of the divided output frequency signal.

17. The method of claim 11, wherein the respective reset control signal is a function of at least one respective programming input signal received for controlling a respective division mode of the at least one second divider cell.

18. The method of claim 11, further comprising:
by each at least one second divider cell:
generating a respective modulus output signal; and
setting the respective modulus output signal to an active level in an event the respective reset control is asserted.

19. The method of claim 11, further comprising:
employing the frequency divider circuit by a fractional-N phase-locked loop (frac-N PLL); and
maintaining the frac-N PLL in a non-reset state throughout a dynamic change to the effective length of the extendable divider chain.

20. The method of claim 11, wherein each first divider cell of the at least one first divider cell is a 2/3 divider cell and each second divider cell of the at least one second divider cell is a resettable 2/3 divider cell.

* * * * *